United States Patent
Palwai

(10) Patent No.: US 8,593,188 B2
(45) Date of Patent: Nov. 26, 2013

(54) APPARATUS TO REMOVE THE LOOP FILTER RESISTOR NOISE IN CHARGE-PUMP PLL

(75) Inventor: Rajkumar Palwai, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/462,973

(22) Filed: May 3, 2012

(65) Prior Publication Data

US 2013/0214832 A1 Aug. 22, 2013

Related U.S. Application Data

(60) Provisional application No. 61/600,745, filed on Feb. 20, 2012.

(51) Int. Cl.
*H03L 7/06* (2006.01)

(52) U.S. Cl.
USPC ............ 327/156; 327/144; 327/146; 327/158

(58) Field of Classification Search
USPC .............. 327/141, 144–163; 331/1/A, 15–17; 375/373–376
See application file for complete search history.

(56) References Cited

U.S. PATENT DOCUMENTS

| | | | | |
|---|---|---|---|---|
| 5,479,126 | A * | 12/1995 | Pan et al. | 327/157 |
| 6,389,092 | B1 * | 5/2002 | Momtaz | 375/376 |
| 6,420,917 | B1 | 7/2002 | Klemmer | |
| 6,549,599 | B2 * | 4/2003 | Momtaz | 375/376 |
| 6,580,329 | B2 * | 6/2003 | Sander | 331/17 |
| 7,689,191 | B2 * | 3/2010 | Kimura et al. | 455/260 |
| 2002/0000884 | A1 * | 1/2002 | Paananen | 331/10 |
| 2005/0134391 | A1 * | 6/2005 | Kimura et al. | 331/16 |
| 2006/0119444 | A1 * | 6/2006 | Horan | 331/17 |
| 2006/0197611 | A1 * | 9/2006 | Yan | 331/16 |
| 2008/0074200 | A1 * | 3/2008 | Cong | 331/16 |
| 2008/0218277 | A1 * | 9/2008 | Tan et al. | 331/17 |
| 2010/0183109 | A1 * | 7/2010 | Lin et al. | 375/376 |

OTHER PUBLICATIONS

Behzad Razavi, Design of Analog CMOS Integrated Circuits, Chapter 15—Section 15.2.3, Basic Charge-Pump PLL, 2001 McGraw-Hill International Edition, pp. 556-562.

Professor S. Long, Phase Locked Loop Circuits, UCSB/ECE Department, Jun. 11, 2008, pp. 1-53 & pp. 633, www.ece.ucsb.edu/~long/ece145b/PLL_intro_FMD_FS.pdf.

* cited by examiner

*Primary Examiner* — Lincoln Donovan
*Assistant Examiner* — Brandon S Cole
(74) *Attorney, Agent, or Firm* — Alan A. R. Cooper; W. James Brady, III; Frederick J. Telecky, Jr.

(57) ABSTRACT

An improved charge pump based phase locked loop where the loop filter resistor noise is reduced by about an order is presented. The voltage controlled oscillator generates a clock signal, and this is input to the phase detector, which, compares the oscillator clock with the reference clock and using the Charge pump it generates a current output proportional to the phase difference. The loop filter converts this proportional current to a voltage and connects it to the oscillator input. The loop filter consists of a capacitor, resistor and the apparatus that bypasses most of the resistor noise.

19 Claims, 2 Drawing Sheets

APPARATUS TO REMOVE THE LOOP FILTER RESISTOR NOISE IN CHARGE-PUMP PLL

PRIORITY

This Application claims priority to U.S. Provisional Application No. 61/600,745, filed Feb. 20, 2012, entitled "A Novel Technique to Remove the Loop Filter Resistor Noise in Charge-Pump PLL", which is incorporated by reference in its entirety.

TECHNICAL FIELD

This Application is directed, in general, to a phased lock loop (PLL), and more specifically, to removing loop filter resistor thermal noise in a PLL.

BACKGROUND

Turning to FIG. 1, illustrated is a conventional PLL 100. A resistor Rcp 155 is used in the PLL 100 for stability purposes, such that a "zero" is created in the loop transfer function, and ensures stability around the unity gain frequency. However, the total phase noise (jitter) of the PLL can be problematic.

Other approaches to solving various issues with PLL loops, such as phase noise characteristics, have been proposed, such as U.S. Pat. No. 6,420,917 B1 to Klemmer, entitled "PLL Loop Filter With Switched-Capacitor Resistor." However, there seems 3 disadvantages with this architecture: 1.) There is a need of extra cap and it might increase the overall loop filter area by 15%, 2.) a non overlapping clock generator is needed to generate the control signals for the switched cap, 3.) two big switches are needed for the switched cap network (Q1 & Q2 in the FIG. 4 of Klemmer), which may add some switching noise at the 'VCTRL' node due to coupling through the parasitic capacitors.

Therefore, there is a need in the art to address at least some of the issues associated with conventional PLL circuits.

SUMMARY

A first aspect provides a circuit, comprising: a phase frequency detector (PFD); an up current switch coupled to an output of the comparative phase detector; a down current switch coupled to an output of the PFD; a current source coupled through the up current switch to a node, a down current sourced coupled through the down current switch to a node, the node coupled to: a) a voltage controlled oscillator (VCO) wherein an output of the VCO is coupled to an input of the PFD, and b) a loop filter resistor bypass circuit, comprising: a loop filter resistor coupled to the node; a capacitor coupled in series with the loop filter resistor, the capacitor also coupled to ground; and a first bypass switch coupled to the node, and a second bypass switch coupled in series to the first bypass switch, the second bypass switch also coupled to the anode of the capacitor, wherein the first bypass switch and the second bypass switch in series are coupled in series with each other and in parallel to the loop filter resistor, wherein the loop filter resistor is employed to create a zero pole in the loop when the first and second bypass switches are not closed, and a first control line coupled from the up current switch to the first bypass resistive element through a CMOS inverter; and a second control line coupled from the up current switch to the second bypass resistive element through another CMOS inverter, wherein the first and second bypass switches are a complementary CMOS pair, wherein the loop filter resistor is employed to create the zero when the first and second bypass switches are not closed, and the noise of a loop filter resistor is bypassed when the loop filter resistor is bypassed.

A second aspect provides a circuit, comprising: a PFD; an up current switch coupled to an output of the comparative phase detector; a down current switch coupled to an output of the PFD; a current source coupled through the up current switch to a node, a down current sourced coupled through the down current switch to a node, the node coupled to: a) VCO wherein an output of the VCO is coupled to an input of the PFD, and b) a loop filter resistor bypass circuit, comprising: a loop filter resistor coupled to the node; a capacitor coupled in series with the loop filter resistor, the capacitor also coupled to ground; and a first bypass switch coupled to the node, and a second bypass switch coupled in series to the first bypass switch, the second bypass switch also coupled to an anode of the capacitor, wherein the first bypass switch and the second bypass switch in series are coupled in series with each other and in parallel to the loop filter resistor.

A third aspect provides a circuit, comprising: A circuit, comprising: a PFD; an up current switch coupled to an output of the comparative phase detector; a down current switch coupled to an output of the comparative phase detector; a current source coupled through the up current switch to a node, a down current sourced coupled through the down current switch to a node, the node coupled to: a) a VCO wherein an output of the VCO is coupled to an input of the PFD, and b) a loop filter resistor bypass circuit, comprising: a loop filter resistor coupled to the node; a capacitor coupled in series with the loop filter resistor, the capacitor also coupled to ground; and a first bypass switch coupled to the node, and a second bypass switch coupled in series to the first bypass switch, the second bypass switch also coupled to an anode of the capacitor, wherein the first bypass switch and the second bypass switch in series are coupled in series with each other and in parallel to the loop filter resistor, wherein the loop filter resistor is employed to create a zero in the circuit when the first and second bypass switches are not closed, and a first control line coupled from the up current switch to the first bypass resistive element; and a second control line coupled from the up current switch to the second bypass resistive element.

BRIEF DESCRIPTION OF THE DRAWINGS

Reference is now made to the following descriptions.

DETAILED DESCRIPTION

Figure 2:
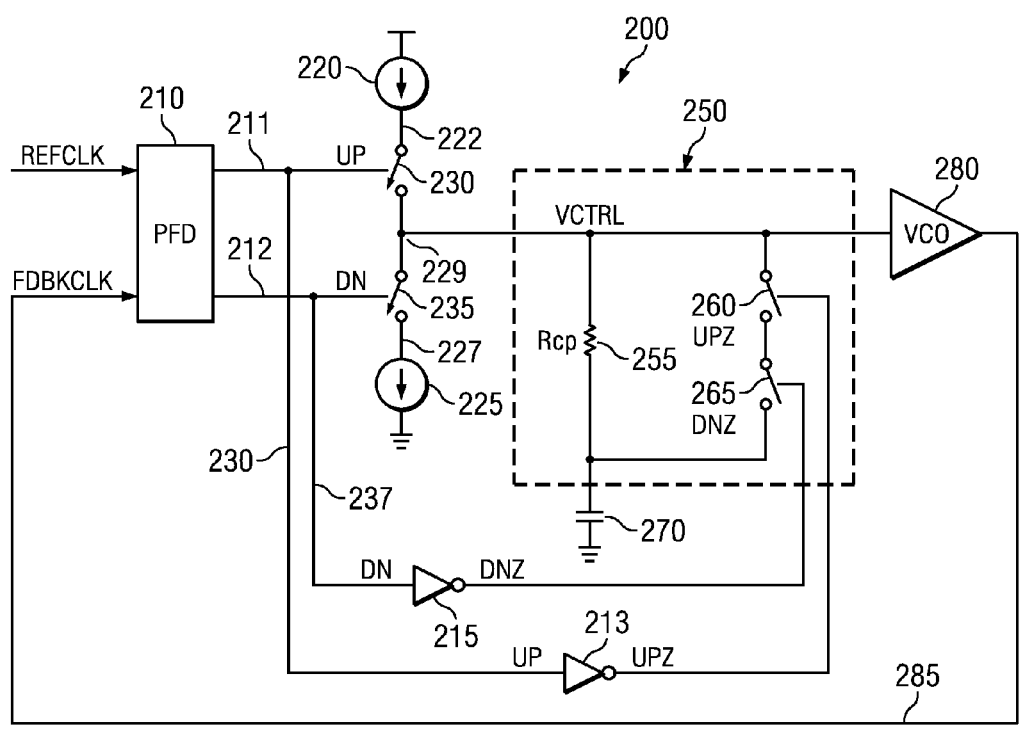
FIG. 2 illustrates a PLL circuit with a loop filter resistor removal circuit.

Turning to FIG. 2, illustrated is one aspect of a PLL with a loop filter resistor removal circuit 200 constructed according to the principles of the present Application. As understood by the named inventor of the present Application, in a typical charge pump PLL, a loop filter resistor is one of the contributors to a total output PLL phase noise (jitter.) By using an approach of removing the loop filter resistor during parts of a PLL cycle, loop filter resistor noise of a PLL can be reduced.

Figure 1:
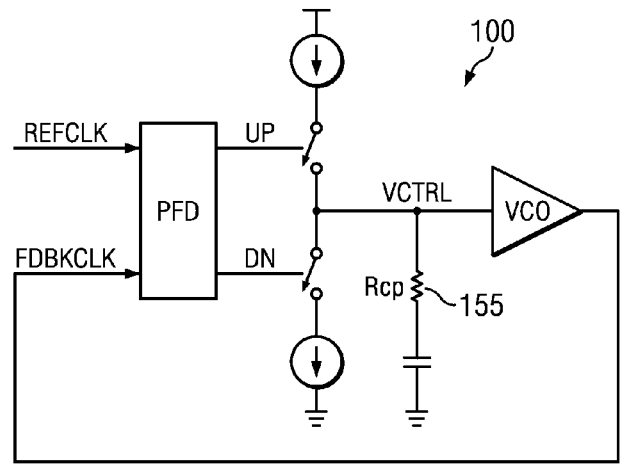
FIG. 1 illustrates a conventional PLL circuit.

Generally, a PLL contains two poles at an origin and a high DC gain, and is therefore unstable. A resistor is added in series to a capacitor as a loop filter resistor to create a zero in a feedback loop of the PLL, and it helps to stabilize the PLL. As is appreciated by the present inventor, the loop filter resistor, as understood by the present inventor, introduction of a resistor Rcp 155 of FIG. 1 introduces further problems in PLL circuits, such as thermal noise, thereby increasing jitter, i.e., adding thermal noise to the PLL and affects the final PLL output clock phase noise. As understood by the inventor, the loop filter resistor becomes one of the main phase noise contributors in high speed, low jitter uses in conventional PLL designs.

For more information on PLLs in general, please see "Design of Analog CMOS Integrated circuits" by Behzad Razavi, section 15.2.3, "Basic Charge-Pump PLL", McGraw Hill International Edition, Publication Date 2001, pages 556-562, hereby incorporated by reference in its entirety, which addresses PLL loop dynamics, and more specifically, to see a discussion of the 2 poles, and it furthermore introduces a discussion of the zero requirement to make PLLs stable.

In the circuit 200, a phase frequency detector (PFD) 210 receives both a REFCLK signal and a FDBKCLK signal. The PFD 210 outputs an UP signal 211 and a down signal DN 212, which drives an up switch 222 and a down switch 227, respectively, off or on. The up switch 222 is coupled to a first charge pump 220, a current source. The down switch 227 is coupled to a second charge pump 225, also a current source. The up switch 222 and the down switch 227 are coupled together at a node 229.

Coupled to the node 229 is a loop filter resistor removal circuit 250, which has a voltage of VCTRL at the node 229. The removal circuit 250 includes a loop filter resistor 255 coupled to the node 229. A first switch UPZ 260 and a second switch DNZ 265 are coupled together in series from the node 229, and are also coupled in parallel to the loop filter resistor 255. The RCP 255 is also coupled to a filter capacitor 270, which is coupled to a ground. The switches 260, 265 can each be a complementary CMOS pair.

The node 229, having a voltage VCTRL, is coupled to an input of the voltage controlled oscillator (VCO) 280. An output of the VCO 280 is then fed back to the PFD 210 over a feedback line 285 as a signal FDBKCLK.

In the PLL circuit 200, the UP line 222 is coupled across a control line 230 across an inverter 213, to the UPZ switch 260, and the down switch 227 is coupled across a control line 235 across an inverter 215 to the DNZ switch 265.

When UP 211 is logic high, UPZ switch 260 is open (logic low). When UP 211 is logic low, UPZ switch 260 is closed (logic high). When DN 212 is logic high, DNZ switch 265 is open (logic low). When DN 212 is logic low, DNZ switch 265 is closed (logic high).

As is understood by the present inventor, typically, once a PLL is "settled", the charge pumps 220, 225 will be active only for a small part of a total PLL cycle, for example, approximately 5% to 10%. Therefore, the loop filter Rcp 255 is only needed for loop stability during this relatively short interval of time. However, in traditional PLLs, unlike the PLL 200 of the present Application, a loop filter resistor is connected to the node 229 all the time and adds its noise, such as thermal noise, all the time throughout the PLL cycle.

In the proposed approach of the principles of the present Application, a loop filter resistor, such as Rcp 255, is employed when either the charge pump 220 or charge pump 225 are charging or discharging the capacitor 270. Closing either switch 222 or switch 227 is then correlated to opening switch 260, 265, respectively, thereby adding loop filter resistor Rcp 255 into use by the PLL 200. However, if both UP switch 222 and DN switch 227 are open, then both UPZ switch 260 and DNZ switch 265 are closed, shorting the Rcp 255. Please note that the combination of resistances of the switches 260 and 265, even when both are shut and added in series, can be an order of magnitude less than that of a resistance of the Rcp 255, thereby leading to a decrease of noise in the circuit. Also, the switches 260 & 265 are complimentary CMOS switches and switching noise from the PMOS & NMOS will kind of cancel each other. Hence, there would be minimal switching noise at the node 229.

In one aspect, through employment of signals generated by the PFD 210 to run the charge pumps 220 and 225, employment of two gates 260 and 265, noise contribution of the PLL loop filter resistor 255 has been substantially reduced. Signals used for one part of the PLL circuit 200 are used in another part of the circuit 200. In the PLL circuit 200, there is an omission of the element of the Rcp 255 for at least a portion of the PLL cycle, yet retention of its function when called for pole loop stability.

In a further aspect, the PLL 200 can be used to generate a clock signal for a sigma delta modulator.

Figure 3A:
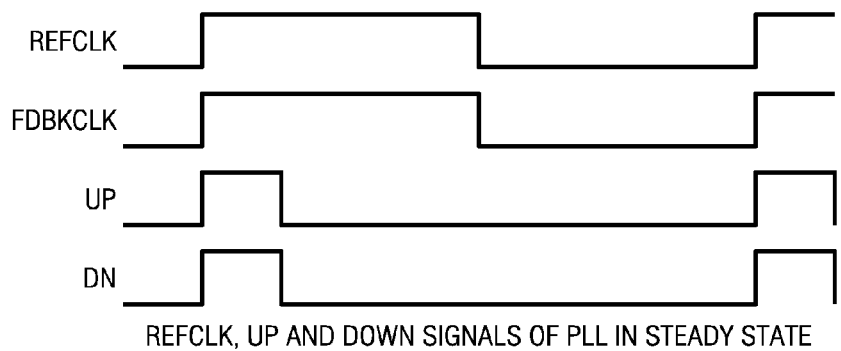
FIG. 3A is an example illustration of signals of FIG. 2 when the PLL of FIG. 2 is in a steady state.
Figure 3B:
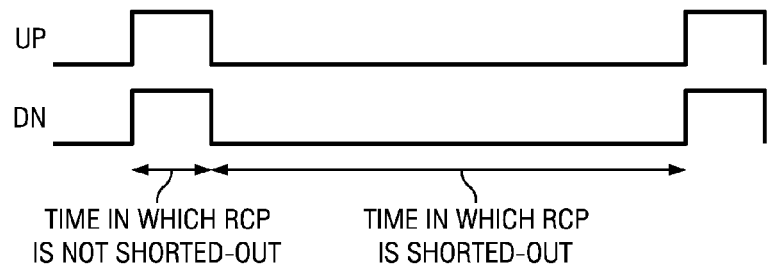
FIG. 3B is an example illustration of received signals of the loop filter resistor removal circuit of FIG. 2.

FIGS. 3A and 3B illustrate timing diagrams of the PLL 200.

Regarding FIG. 3A, as is illustrated, once the PLL 200 reaches steady state, both of the clocks REFCLK and FDBCLK have the same frequency and will be aligned in phase. In this state, the charge pumps will be active only for a short duration of time to avoid dead band, and this dead-band time is typically around 5%-10% of the clock period, Tclk. Steady state waveforms are illustrated in FIG. 3A.

Figure 4:
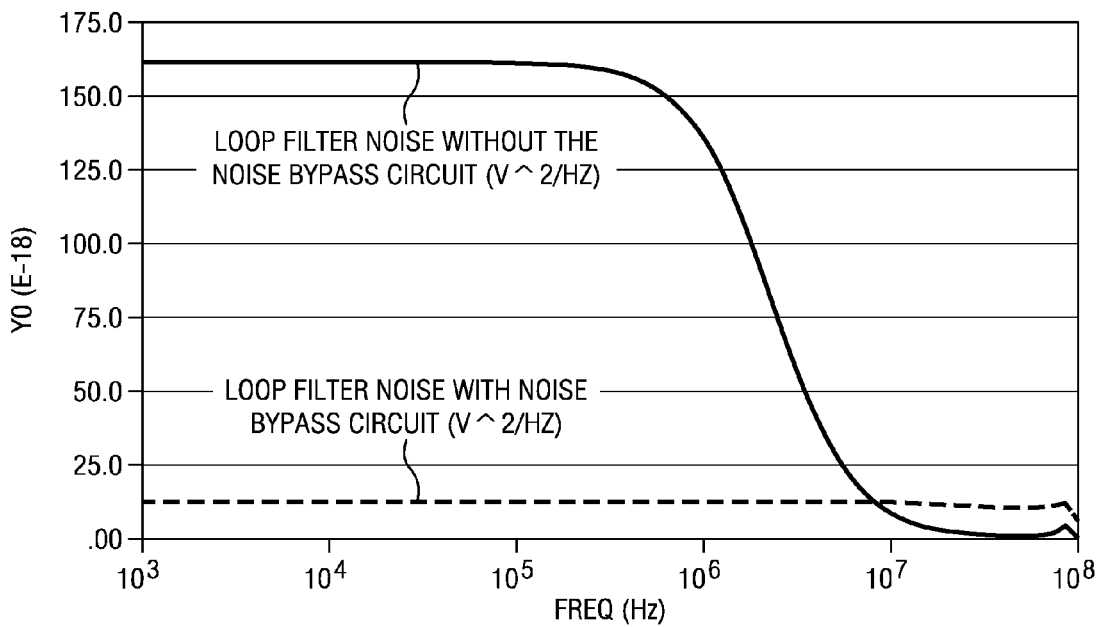
FIG. 4 is an example simulation plot comparing the spectral noise densities of the loop filter noise with and without the noise bypass circuit.

Regarding FIG. 3B, illustrated is an example behavior of the switches 222, 227. As is illustrated, as the UP and DN switch on/logic high signals are applied on to switches 222, 227, switches 260 and 265 are open, thereby adding loop filter resistor Rcp 255 into the filter circuit. However, when off signals are applied to switches 222, 227, switches 260 and 265 are closed, thereby shorting out the Rcp 255 and adding less noise at node 229. FIG. 4 shows a plot of the noise spectral densities of a loop filter with and without the noise bypass circuit. The typical values assumed are Rcp=8 K·Ohm, Cap=200 pF and total resistance of the bypass switches is 350 Ohm and the bypass switch is switched ON for 90% of the clock period.

FIG. 4 illustrates an example simulation plot comparing the spectral noise densities of the loop filter noise with and without the noise bypass circuit. From the figure, it was evident that the spectral noise density without the bypass circuit is higher than that with the bypass circuit till some cut-off frequency (Fcut). This 'Fcut' frequency depends on the ratio of the combined bypass switch resistance to the Rcp. The loop filter noise see's a band-pass transfer function to the final PLL output, with the upper cut-off frequency being the PLL Unity Gain Bandwidth (UGB). So ideally all the loop filter noise above the PLL UGB frequency will be killed by the PLL loop and hence is of less concern. So bypass switch impedance is carefully designed such that the total integrated noise power till the PLL UGB is lesser for the loop filter with the bypass switch.

Those skilled in the art to which this application relates will appreciate that other and further additions, deletions, substitutions and modifications may be made to the described embodiments.

What is claimed is:

1. A circuit, comprising:
a phase frequency detector (PFD);
an up current switch coupled to an output of the comparative phase detector;
a down current switch coupled to an output of the comparative phase detector;
a current source coupled through the up current switch to a node,
a down current sourced coupled through the down current switch to a node,
the node coupled to:
a) a voltage controlled oscillator (VCO) wherein an output of the VCO is coupled to an input of the PFD, and
b) a loop filter resistor bypass circuit, comprising:
a loop filter resistor coupled to the node;
a capacitor coupled in series with the loop filter resistor, the capacitor also coupled to ground; and
a first bypass switch coupled to the node, and
a second bypass switch coupled in series to the first bypass switch,
the second bypass switch also coupled to an anode of the capacitor,
wherein the first bypass switch and the second bypass switch in series are coupled in series with each other and in parallel to the loop filter resistor,
wherein the loop filter resistor is employed to create a zero in the circuit to create a zero pole when the first and second bypass switches are not closed, and
a first control line coupled from the up current switch to the first bypass switch; and
a second control line coupled from the up current switch to the second bypass switch,
wherein the first and second bypass switches are a complementary CMOS pair,
wherein the loop filter resistor is employed to create a zero in the circuit and create the zero pole when the first and second bypass switches are not closed, and
a noise of a loop filter resistor is bypassed when the loop filter resistor is bypassed.

2. The circuit of claim 1, wherein the circuit comprises a phased lock loop (PLL).

3. The circuit of claim 2, wherein a noise of the loop filter resistor is bypassed when the loop filter resistor is bypassed, thereby yielding less jitter in the PLL loop.

4. The circuit of claim 1, wherein the first and second bypass switches are a complementary CMOS pair.

5. The circuit of claim 1, further comprising:
a first control line coupled from the up current switch to the first bypass resistive element through a first inverter; and
a second control line coupled from the up current switch to the second bypass resistive element through a second inverter.

6. The circuit of claim 1, further comprising wherein the circuit is configured to substantially simultaneously turn on and off the current source coupled through the up current switch to a node and a first bypass switch.

7. The circuit of claim 1, further comprising wherein the circuit is configured to substantially simultaneously turn on and off the current source coupled through the down current switch to a node and a first bypass switch.

8. The circuit of claim 1, wherein a loop filter resistor is bypassed by a closed first bypass switch and second bypass switch.

9. The circuit of claim 1, wherein the resistive element has at least ten times a resistance than a combined resistance of the first and the second bypass switches.

10. The circuit of claim 1, wherein the loop filter resistor is employed to create a zero in the circuit when the first and second bypass switches are not closed.

11. A circuit, comprising:
a phase frequency detector (PFD);
an up current switch coupled to an output of the phase frequency detector;
a down current switch coupled to an output of the phase frequency detector;
a current source coupled through the up current switch to a node,
a down current sourced coupled through the down current switch to a node,
the node coupled to:
a) a voltage controlled oscillator (VCO) wherein an output of the VCO is coupled to an input of the PFD, and
b) a loop filter resistor bypass circuit, comprising:
a loop filter resistor coupled to the node;
a capacitor coupled in series with the loop filter resistor, the capacitor also coupled to ground; and
a first bypass switch coupled to the node, and
a second bypass switch coupled in series to the first bypass switch,
the second bypass switch also coupled to an anode of the capacitor,
wherein the first bypass switch and the second bypass switch in series are coupled in series with each other and in parallel to the loop filter resistor; a first control line coupled from the up current switch to the first bypass switch and a second control line coupled from the up current switch to the second bypass switch.

12. The circuit of claim 11, wherein the circuit comprises a phased lock loop (PLL).

13. The circuit of claim 11, wherein the first and second bypass switches are a complementary CMOS pair.

14. The circuit of claim 11, further comprising wherein the circuit is configured to substantially simultaneously turn on and off the current source coupled through the up current switch to a node and a first bypass switch.

15. The circuit of claim 11, further comprising wherein the circuit is configured to substantially simultaneously turn on and off the current source coupled through the down current switch to a node and a first bypass switch.

16. The circuit of claim 11, wherein a resistive element is bypassed by a closed first bypass switch and second bypass switch.

17. The circuit of claim 16, wherein a noise of the loop filter resistor is bypassed when the loop filter resistor is bypassed, thereby yielding less jitter in the PLL loop.

18. A circuit, comprising:
a phase frequency detector (PFD);
an up current switch coupled to an output of the comparative phase detector;
a down current switch coupled to an output of the comparative phase detector;
a current source coupled through the up current switch to a node,
a down current sourced coupled through the down current switch to a node, the node coupled to:
a) a voltage controlled oscillator (VCO) wherein an output of the VCO is coupled to an input of the PFD, and
b) a loop filter resistor bypass circuit, comprising:
a loop filter resistor coupled to the node;
a capacitor coupled in series with the loop filter resistor, the capacitor also coupled to ground; and
a first bypass switch coupled to the node, and
a second bypass switch coupled in series to the first bypass switch,
the second bypass switch also coupled to an anode of the capacitor,
wherein the first bypass switch and the second bypass switch in series are coupled in series with each other and in parallel to the loop filter resistor,
wherein the loop filter resistor is employed to create a zero in the circuit when the first and second bypass switches are not closed, and
a first control line coupled from the up current switch to the first bypass resistive element; and
a second control line coupled from the up current switch to the second bypass resistive element.

19. The circuit of claim 18, wherein the circuit comprises a phased lock loop (PLL).

* * * * *